(12) United States Patent
Jung

(10) Patent No.: US 12,225,728 B2
(45) Date of Patent: Feb. 11, 2025

(54) METHOD FOR FABRICATING SEMICONDUCTOR MEMORY DEVICE INCLUDING CHANNEL POSTS OF DIFFERENT SHAPES

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/306,092

(22) Filed: Apr. 24, 2023

(65) Prior Publication Data

US 2023/0262982 A1    Aug. 17, 2023

Related U.S. Application Data

(63) Continuation of application No. 16/931,048, filed on Jul. 16, 2020, now Pat. No. 11,672,122.

(30) Foreign Application Priority Data

Apr. 20, 2020    (KR) ........................ 10-2020-0047218

(51) Int. Cl.
*H10B 43/30* (2023.01)
*H10B 43/10* (2023.01)
*H10B 43/27* (2023.01)

(52) U.S. Cl.
CPC ............. *H10B 43/30* (2023.02); *H10B 43/10* (2023.02); *H10B 43/27* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS

2009/0296476 A1    12/2009  Shin et al.
2012/0098049 A1    4/2012   Moon et al.
(Continued)

FOREIGN PATENT DOCUMENTS

CN    102263065 A    11/2011
CN    103779353 A    5/2014
(Continued)

*Primary Examiner* — Didarul A Mazumder
*Assistant Examiner* — Gustavo G Ramallo
(74) *Attorney, Agent, or Firm* — WILLIAM PARK & ASSOCIATES LTD.

(57) ABSTRACT

A semiconductor memory device includes an electrode structure, a plurality of channel posts, and at least one gate separation layer. The electrode structure includes insulating interlayers and gate conductive layers which are alternately stacked. The channel posts are formed through the electrode structure. The gate separation layer is formed between the channel posts. The gate separation layer separates an uppermost gate conductive layer among the gate conductive layers. Each channel post among the channel posts adjacent to the gate separation layer has a gibbous moon shape in a planar view. The semiconductor memory device further includes a slit structure arranged at both sides of the gate separation layer. The slit structure is formed through the electrode structure. Each channel post among the channel posts adjacent to the slit structure has a gibbous moon shape in the planar view.

10 Claims, 16 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50

See application file for complete search history.

(56) References Cited

U.S. PATENT DOCUMENTS

| | | | |
|---|---|---|---|
| 2013/0009235 A1 | 1/2013 | Yoo | |
| 2015/0115345 A1* | 4/2015 | Nowak | H01L 29/66833 257/314 |
| 2015/0194435 A1 | 7/2015 | Lee | |
| 2015/0243675 A1 | 8/2015 | Lim et al. | |
| 2017/0077136 A1* | 3/2017 | Kim | H01L 29/40117 |
| 2017/0179144 A1 | 6/2017 | Han | |
| 2017/0194340 A1 | 7/2017 | Lue | |
| 2017/0338238 A1 | 11/2017 | Zhang | |
| 2018/0191481 A1* | 7/2018 | Son | H04L 5/0091 |
| 2018/0247953 A1* | 8/2018 | Lee | H10B 43/40 |
| 2019/0067314 A1 | 2/2019 | Lu et al. | |

FOREIGN PATENT DOCUMENTS

| | | |
|---|---|---|
| CN | 104821319 A | 8/2015 |
| CN | 107611136 A | 1/2018 |
| CN | 109671711 A | 4/2019 |
| KR | 1020180021563 A | 3/2018 |
| KR | 1020190013025 A | 2/2019 |
| KR | 1020190041283 A | 4/2019 |
| KR | 1020190115754 A | 10/2019 |
| KR | 1020150081393 A | 7/2020 |

* cited by examiner

METHOD FOR FABRICATING SEMICONDUCTOR MEMORY DEVICE INCLUDING CHANNEL POSTS OF DIFFERENT SHAPES

CROSS-REFERENCES TO RELATED APPLICATION

The present application is a continuation application of U.S. patent application Ser. No. 16/931,048, filed on Jul. 16, 2020, and claims priority under 35 U.S.C. § 119(a) to Korean application number 10-2020-0047218, filed on Apr. 20, 2020, in the Korean Intellectual Property Office, which is incorporated herein by reference in its entirety.

BACKGROUND

1. Technical Field

Various embodiments may generally relate to an electronic device, more particularly, a semiconductor memory device and a method of manufacturing the semiconductor memory device.

2. Related Art

In order to provide a semiconductor device with good performance at a low price point, it may be required to increase a degree of integration for the semiconductor device. Particularly, because the integration degree of the semiconductor device may be an important factor for determining the price, an increased integration degree may be continuously required. Thus, three-dimensional semiconductor memory devices including three-dimensionally arranged memory cells are produced.

SUMMARY

Example embodiments provide a semiconductor memory device having a stable structure and a high integration degree.

Example embodiments also provide a method of manufacturing the above-indicated semiconductor memory device.

In example embodiments of the present disclosure, a semiconductor memory device may include an electrode structure, a plurality of channel posts and at least one gate separation layer. The electrode structure may include insulating interlayers and gate conductive layers which are alternately stacked. The channel posts may be formed through the electrode structure. The gate separation layer may be formed between the channel posts. The gate separation layer may be configured to separate an uppermost gate conductive layer among the gate conductive layers. Each channel post among the channel posts adjacent to the gate separation layer may have a gibbous moon shape in a planar view. The semiconductor memory device may further include a slit structure arranged at both sides of the gate separation layer. The slit structure may be formed through the electrode structure. Each of channel posts among the channel posts adjacent to the slit structure may have a gibbous moon shape in the planar view.

In example embodiments, each of the channel posts adjacent to the gate separation layer may have a simple closed curve shape in the planar view including at least two curves that may include edge lines having different curvatures. Each of the channel posts adjacent to the gate separation layer may include a first sector and a second sector. The first sector and a second sector may have different central angles. A curve in the first sector may have a curvature different from a curvature of a curve in the second sector. A first distance between the center point of the first and second sectors and a center point of the curve in the first sector may be shorter than a second distance between the center point of the first and second sectors and a center point of the curve in the second sector. The curve in the second sector may face a sidewall of the gate separation layer.

In example embodiments, the gate separation layer may include a trench and a separating insulation layer. The trench may be formed at the electrode structure to separate the uppermost gate conductive layer. The separation insulation layer may be formed in the trench. The trench may have a sidewall spaced apart from a sidewall of each of the channel posts adjacent to the gate separation layer. Alternatively, the gate separation layer may include a trench and a separating insulation layer. The trench may be formed at the electrode structure to separate the uppermost gate conductive layer. The separation insulation layer may be formed in the trench. The trench may have a sidewall configured to make contact with a sidewall of each of the channel posts adjacent to the gate separation layer.

In example embodiments, the gate separation layer may include a first trench, a spacer, a second trench and a separating insulation layer. The first trench may be formed at an uppermost insulating interlayer among the insulating interlayers. The spacer may be formed on a sidewall of the first trench. The second trench may be extended from a bottom surface of the first trench to separate the uppermost gate conductive layer. The second trench may have a width narrower than a width of the first trench. The separating insulation layer may be formed in the first and second trenches. The first trench may have a sidewall configured to make contact with a sidewall of each of the channel post adjacent to the gate separation layer. The second trench may have a sidewall spaced apart from the sidewall of each of the channel posts adjacent to the gate separation layer.

In example embodiments, the uppermost gate conductive layer separated by the gate separation layer may have a gate all around (GAA) structure configured to fully surround each of the channel posts adjacent to the gate separation layer. The rest channel posts except for the channel posts adjacent to the gate separation layer may have a circular shape or an ellipse shape in the planar view. Each of the channel posts may include an opening, a memory layer, a channel layer, a core layer and a capping layer. The opening may be formed through the electrode structure. The memory layer may be formed on a surface of the opening. The memory layer may include a tunnel insulation layer, a charge-trapping layer and a blocking layer sequentially stacked. The channel layer may be formed on the memory layer. The core layer may be formed on the channel layer to partially fill the opening. The capping layer may be formed on the core layer to fill the opening. The capping layer may be electrically connected to the channel layer.

In example embodiments of the present disclosure, according to a method of a semiconductor memory device, an insulating interlayer and a sacrificial layer may be alternately stacked on a substrate to form a stack structure. The stack structure may be etched to form a gate separation layer configured to separate an uppermost sacrificial layer among the sacrificial layers. A plurality of channel posts may be formed through the stack structure. Each of channel post among the channel posts adjacent to the gate separation layer may have a gibbous moon shape in a planar view. The sacrificial layer may be replaced with a gate conductive layer. The method may further include forming a slit structure arranged at both sides of the gate separation layer. The slit structure may be formed through the electrode structure. Each of channel posts among the channel posts adjacent to the slit structure may have a gibbous moon shape in the planar view.

In example embodiments, each of the channel posts adjacent to the gate separation layer may have a simple closed curve in the planar view including at least two curves that may include edge lines having different curvatures. Each of the channel posts adjacent to the gate separation layer may include a first sector and a second sector. The first sector and a second sector may have different central angles. A curve in the first sector may have a curvature different from a curvature of a curve in the second sector. A first distance between the center point of the first and second sectors and a center point of the curve in the first sector may be shorter than a second distance between the center point of the first and second sectors and a center point of the curve in the second sector. The curve in the second sector may face a sidewall of the gate separation layer.

In example embodiments, forming the gate separation layer may include selectively etching the stack structure to form a trench configured to separate the uppermost sacrificial layer, and filling the trench with a separating insulation layer. The trench may have a sidewall spaced apart from a sidewall of each of the channel posts adjacent to the gate separation layer. Alternatively, the separation insulation layer may be formed in the trench. The trench may have a sidewall configured to make contact with a sidewall of each of the channel posts adjacent to the gate separation layer.

In example embodiments, forming the gate separation layer may include selectively etching an uppermost insulating interlayer among the insulating interlayers to form a first trench, forming a spacer on a sidewall of the first trench, etching the stack structure using the spacer as an etch barrier to form a second trench configured to separate the uppermost sacrificial layer, and filling the first and second trenches with a separating insulation layer. The second trench may be extended from a bottom surface of the first trench. The second trench may have a width narrower than a width of the first trench. The separating insulation layer may be formed in the first and second trenches. The first trench may have a sidewall configured to make contact with a sidewall of each of the channel post adjacent to the gate separation layer. The second trench may have a sidewall spaced apart from the sidewall of each of the channel posts adjacent to the gate separation layer.

According to example embodiments, the channel post adjacent to the gate separation layer may have the gibbous moon shape in the planar view to ensure a gap between the gate separation layer and the channel posts and to increase an integration degree of a memory block. Further, the gate separation layer may include the first trench, the spacer, the second trench and the separating insulation layer to readily increase the integration degree of the memory block.

Further, because the channel post adjacent to the gate separation layer may have the gibbous moon shape in the planar view, the gate conductive layer separated by the gate separation layer may have the GAA structure configured to fully surround each of the channel posts adjacent to the gate separation layer to increase operational characteristics of the semiconductor memory device.

Furthermore, because the channel post adjacent to the slit structure may also have the gibbous moon shape in the planar view, the integration degree of the memory block may be more increased.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Hereinafter, a semiconductor memory device and a method of manufacturing the same in accordance with example embodiments may be illustrated in detail. In example embodiments, a first direction D1 may be an x-direction or a row direction, and a second direction D2 may be a y-direction or a column direction substantially perpendicular to the x-direction D1. A third direction D3 may be a z-direction or a vertical direction substantially perpendicular to the first direction D1 and the second direction D2. Alternatively, the first direction D1 may be the y-direction and the second direction D2 may be the x-direction.

Figure 1A:
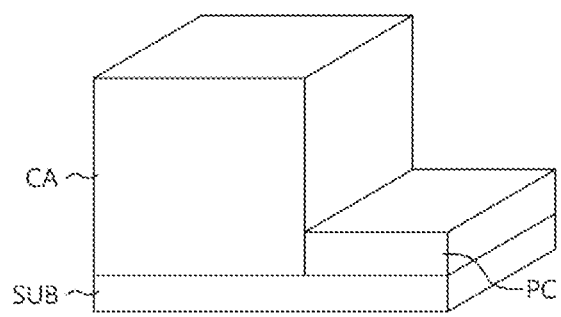
FIGS. 1A and 1B are block diagrams illustrating a semiconductor memory device in accordance with example embodiments.
Figure 1B:
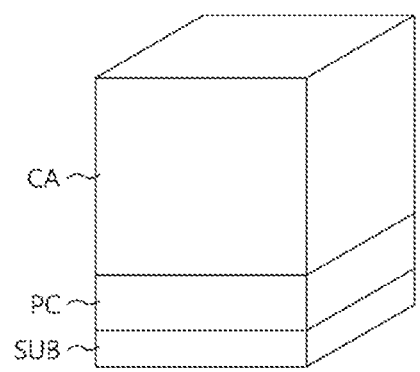

FIGS. 1A and 1B are block diagrams illustrating a semiconductor memory device in accordance with example embodiments.

Referring to FIGS. 1A and 1B, the semiconductor memory device may include a peripheral circuit PC and a cell array CA on a substrate SUB.

The substrate SUB may include a single crystalline semiconductor substrate. For example, the substrate SUB may include a bulk silicon substrate, a silicon-on-insulator (SOI) substrate, a germanium substrate, a germanium-on-insulator (GOI) substrate, a silicon-germanium substrate, an epitaxial substrate formed by a selective epitaxial growth (SEG) process, etc.

The cell array CA may include a plurality of memory blocks. Each of the memory blocks may include a plurality of cell strings. Each of the cell strings may be electrically connected to a bit line, a source line, word lines, and selection lines. Each of the cell strings may include memory cells and selection transistors serially connected with each other. Each of the selection lines may be used as a gate electrode of corresponding selection transistor. Each of the word lines may be used as a gate electrode of a corresponding memory cell.

The peripheral circuit PC may include NMOS transistor, PMOS transistors, a register and a capacitor electrically connected with the cell array CA. The NMOS transistors, the PMOS transistors, the register, and the capacitor may be used as elements of a row decoder, a column decoder, a page buffer, and a control circuit.

As shown in FIG. 1A, the cell array CA and the peripheral circuit PC on the substrate SUB may be arranged adjacent to each other.

Alternatively, as shown in FIG. 1B, the peripheral circuit PC and the cell array CA may be sequentially stacked on the substrate SUB. In this case, the peripheral circuit PC may be overlapped with the cell array CA to decrease an area of the substrate SUB on which the cell array CA and the peripheral circuit PC may occupy.

Figure 2:
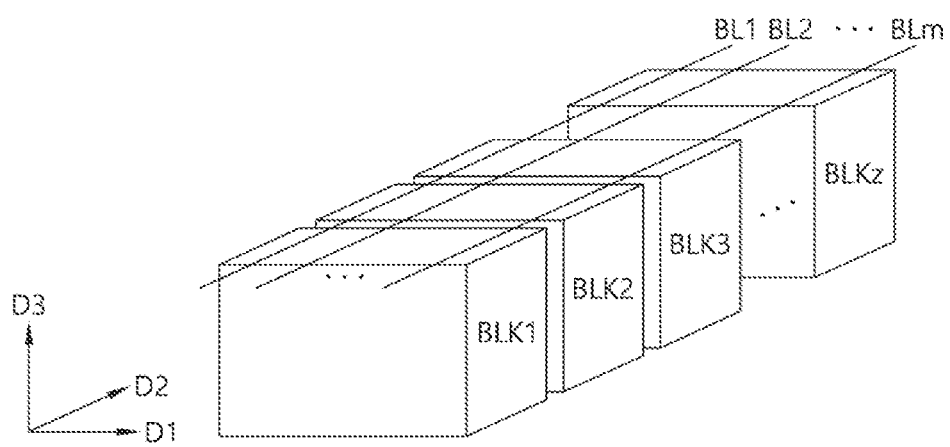
FIG. 2 is a view illustrating memory blocks of a semiconductor memory device in accordance with example embodiments.

FIG. 2 is a view illustrating memory blocks of a semiconductor memory device in accordance with example embodiments.

Referring to FIG. 2, the cell array CA of the semiconductor memory device may include a plurality of memory blocks BLK1~BLKz. The memory blocks BLK1~BLKz may be spaced apart from each other along the second direction D2 corresponding to an extending direction of bit lines BL1~BLm. For example, the first to zth memory blocks BLK1~BLKz may be spaced apart from each other in the second direction D2. The first to zth memory blocks BLK1~BLKz may include memory cell stacked in the third direction D3.

Figure 3:
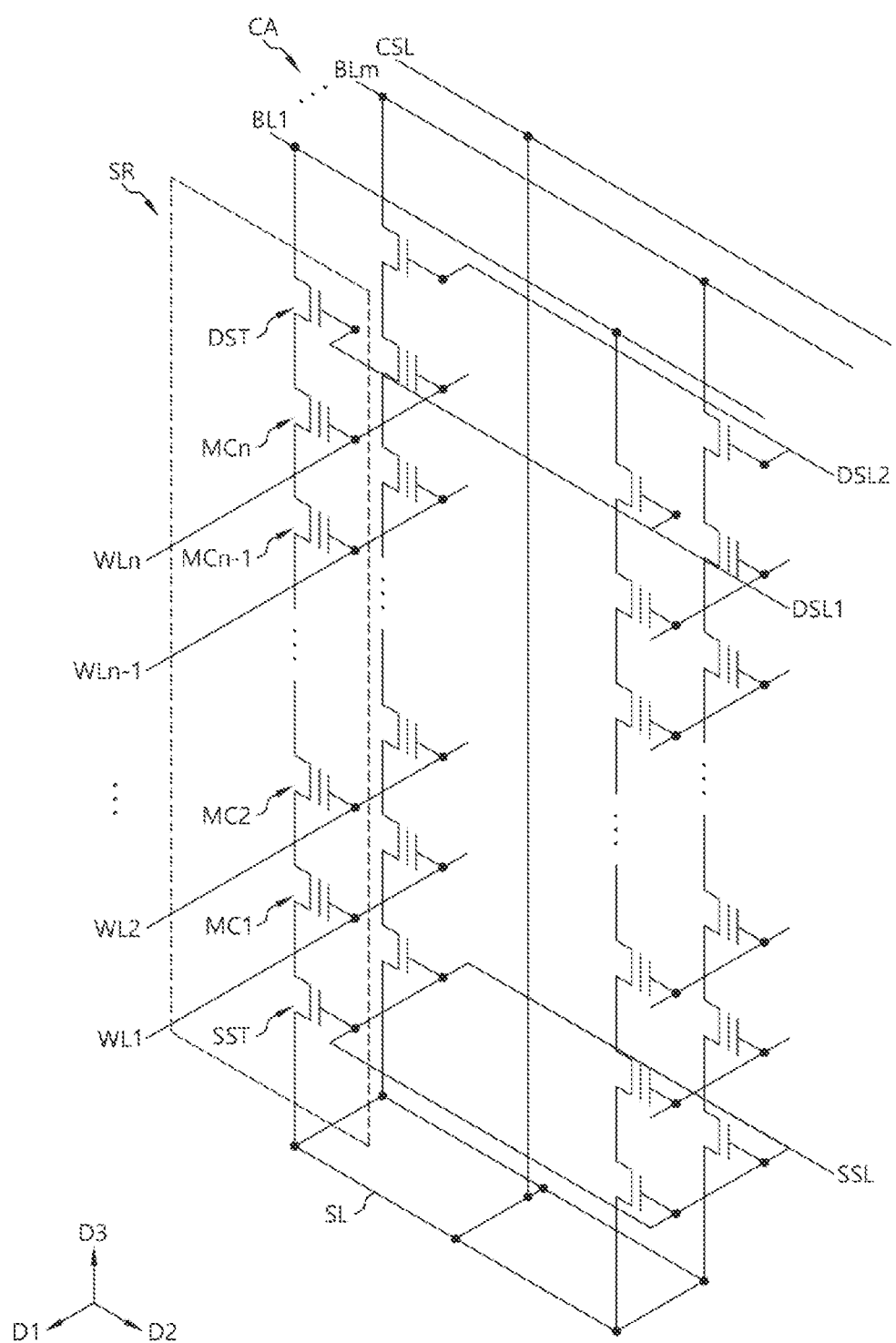
FIG. 3 is an equivalent circuit diagram illustrating a memory block of a semiconductor memory device in accordance with example embodiments.

FIG. 3 is an equivalent circuit diagram illustrating a memory block of a semiconductor memory device in accordance with example embodiments.

Referring to FIG. 3, the cell array CA of the semiconductor memory device may include the memory blocks. Each of the memory blocks may include the cell strings SR. Each of the cell strings SR may include at least one source selection transistor SST, a plurality of memory cell transistors MC1~MCn, and at least one drain selection transistor DST serially connected with each other. FIG. 3 may show one cell string SR including one source selection transistor SST and one drain selection transistor DST. Alternatively, each of the source selection transistor SST and the drain selection transistor DST may include a plurality of selection transistors serially connected with each other. Numbers of the serially connected source selection transistors may be substantially the same as numbers of the serially connected drain selection transistors. Alternatively, the numbers of the serially connected source selection transistors may be more than the numbers of the serially connected drain selection transistors.

The cell strings SR may be arranged along the first direction D1 and the second direction D2 in a matrix shape to form an array. The cell strings SR on a same line in the second direction D2 may be connected to a same bit line. The cell strings SR on a same line in the first direction D1 may be commonly connected to gate lines SSL, WL1~WLn and DSL.

The source selection transistor SST, the memory cell transistors MC1~MCn and the drain selection transistor DST in one cell string ST may be configured to share one channel layer. The cell strings SR may be arranged between the bit lines BL1~BLm and a source line SL. The gate lines SSL, WL1~WLn and DSL may be stacked between the bit lines BL1~BLm and the source line SL. Each of the gate lines SSL, WL1~WLn and DSL may be electrically isolated from each other.

The source selection line SSL may be used as a gate electrode of the source selection transistor SST. The source selection transistors SST in the memory block may share one source selection line SSL. The word lines WL1~WLn may be used as gate electrodes of the memory cell transistors MC1~MCn. Drain selection lines DSL1 and DSL2 may be used as a gate electrode of the drain selection transistor DST. The drain selection lines DSL1 and DSL2 may be separated into a first drain selection line DSL1 and a second drain selection line DSL2 by a gate separation layer. A part of the drain selection transistors DST in the memory block may share the first drain selection line DSL1. The rest of the drain selection transistors DST may share the second drain selection line DSL2. The source selection line SSL may be arranged under the word lines WL1~WLn. The drain selection line DSL may be arranged over the word lines WL1~WLn.

Each of the bit lines BL1~BLm may be connected to the drain selection transistors DST of the cell string SR arranged along the second direction D2. For example, the cell strings SR commonly connected to one drain selection line DSL may be connected with different bit lines BL1~BLm. Thus, when any one of the drain selection lines DSL and any one of the bit lines BL1~BLm may be selected, any one of the cell strings SR may also be selected.

The source lines SL may be electrically connected with a common source line CSL. The source line SL may be configured to transmit an operational voltage, which may be applied to the common source line CSL, to the cell strings SR. The operational voltage may be selectively transmitted to the cell strings SR in accordance with a voltage level of the source selection line SSL.

Figure 4A:
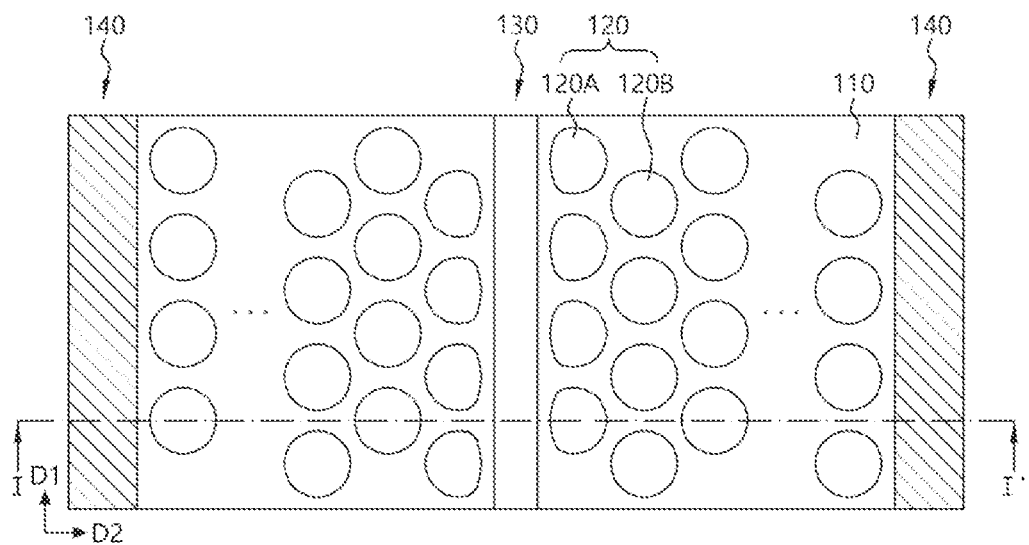
FIG. 4A is a plan view illustrating a semiconductor memory device in accordance with a first example embodiment.
Figure 4B:
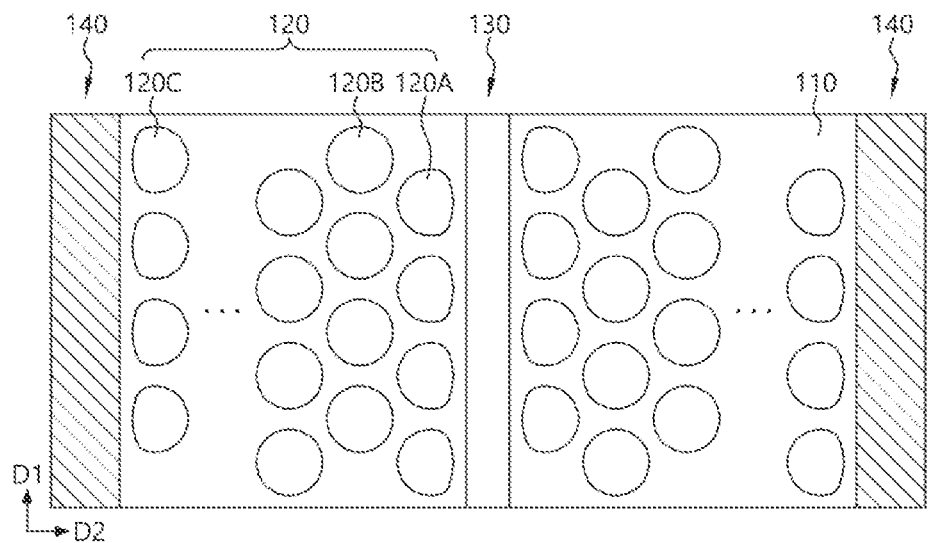
FIG. 4B is a plan view illustrating a modified semiconductor memory device in accordance with the first example embodiment.
Figure 5:
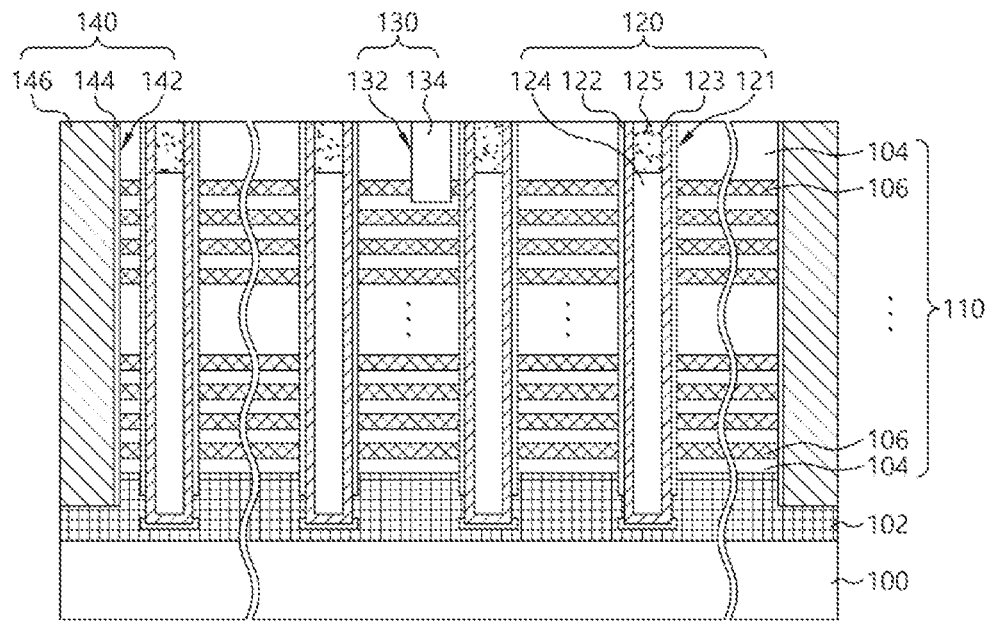
FIG. 5 is a cross-sectional view taken along a line I-I' in FIG. 4A.
Figure 6:
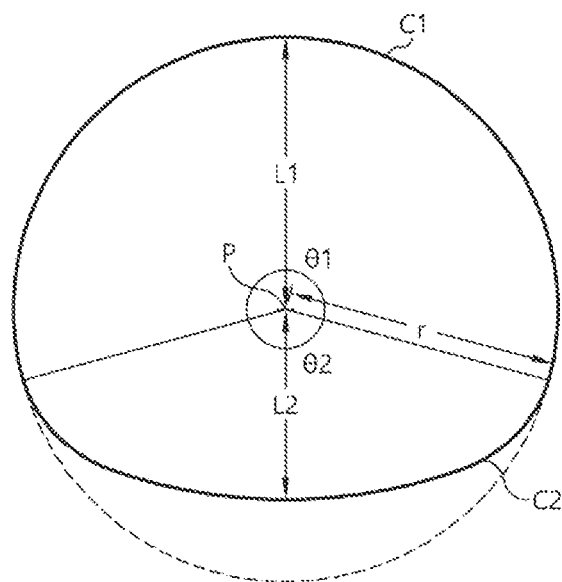
FIG. 6 is a view illustrating a planar shape of a first channel post adjacent to a gate separation layer in the semiconductor memory device in accordance with the first example embodiment.

FIG. 4A is a plan view illustrating a semiconductor memory device in accordance with a first example embodiment, FIG. 4B is a plan view illustrating a modified semiconductor memory device in accordance with the first example embodiment, FIG. 5 is a cross-sectional view taken along a line I-I' in FIG. 4A, and FIG. 6 is a view illustrating a planar shape of a first channel post adjacent to a gate separation layer in the semiconductor memory device in accordance with the first example embodiment.

Referring to FIGS. 4A, 5, and 6, a semiconductor memory device of the first example embodiment may include a source line layer 102, an electrode structure 110, a plurality of channel posts 120, at least one gate separation layer 130, and a slit structure 140.

The source line layer 102 may be formed on a substrate 100. The electrode structure 110 may include insulating interlayer 104 and gate conductive layers 106 alternately stacked on the source line layer 102. The channel posts 120 may be formed through the electrode structure 110. The gate separation layer 130 may be formed between the channel posts 120 to separate an uppermost gate conductive layer 106 among the gate conductive layers 106. The slit structure 140 may be formed through the electrode structure 110 to divide memory blocks BLK. A first channel post 120A among the channel posts 120 adjacent to the gate separation layer 130 may have a gibbous moon shape in a planar view. Further, as shown in FIG. 4B, a third channel post 120C adjacent to the slit structure 140 may also have the gibbous moon shape.

The source line layer 102 on the substrate 100 may have a plate shape corresponding to the memory block BLK. The source line layer 102 may be electrically connected to the channel posts 120. The source line layer 102 may function as a junction region of the source selection transistor SST. The source line layer 102 may include a doped semiconductor layer. For example, the source line layer 102 may include a silicon layer doped with n type impurities. Although not depicted in drawings, when a structure together with the peripheral circuit may be formed under the source line layer 102, an insulation layer may be formed between the substrate 100 and the source line layer 102.

The electrode structure 110 may include the insulating interlayers 104 and the gate conductive layers 106 alternately stacked. The insulating interlayers 104 may be positioned at an uppermost layer and a lowermost layer in the electrode structure 110. The uppermost insulating interlayer 104 may have a thickness thicker than thicknesses of other insulating interlayers 104. The uppermost insulating interlayers 104 may include stacked insulation layers. The stacked insulation layers may include a same insulation material. The lowermost gate conductive layer 106 in the electrode structure 110 may function as a gate or the source selection line SSL of the source selection transistor SST. The uppermost gate conductive layer 106 may function as a gate or the drain selection line DSL of the drain selection transistor DST. The gate conductive layers 106 between the gate of the source selection transistor SST and the gate of the drain selection transistor DST may function as a gate or a word line of the memory cell MC.

The channel posts 120 may be arranged in a matrix shape. Particularly, the channel posts 120 may be aligned with each other in the first direction D1. The channel posts 120 may be arranged in a zigzag shape in the second direction D2.

Each of the channel posts 120 may include an opening 121, a memory layer 122, a channel layer 123, a core layer 124, and a capping layer 125. The opening 121 may be formed through the electrode structure 110. The opening 121 may be partially extended into the source line layer 102. The memory layer 122 may be formed on an inner surface of the opening 121. The channel layer 123 may be formed on the memory layer 122. The core layer 124 may be formed on the channel layer 123 to partially fill the opening 121. The capping layer 125 may be formed on the core layer 124 to fully fill the opening 121. The memory layer 122 may include a tunnel insulation layer, a charge-trapping layer and a block layer sequentially stacked. The tunnel insulation layer and the blocking layer may include oxide. The charge-trapping layer may include nitride. For example, the channel layer 123 may include a semiconductor layer such as a silicon layer. The channel layer 123 may be electrically connected with the source line layer 102. The core layer 124 may include an insulation layer. The capping layer 125 may include a doped semiconductor layer, for example, a silicon layer doped with n type impurities. The capping layer 125 may function as a junction region of the drain selection transistor DST. An interface between the core layer 124 and the capping layer 125 may be higher than an upper surface of the uppermost gate conductive layer 106.

The channel posts 120 may include the first channel post 120A adjacent to the gate separation layer 130 and remaining second channel posts 120B. The planar shape of the first channel post 120A may be the gibbous moon shape. A planar shape of the second channel posts 120B may be a circular shape or an elliptical shape. The planar gibbous moon shape of the first channel post 120A may reduce a size of the memory block BLK to increase an integration degree of the semiconductor memory device. Further, the similar shapes of the first channel post 120A and the second channel posts 120B may function as to prevent characteristic deviations between the transistors of the memory cell MC from being generated. In FIG. 6, a dotted line may represent a full moon shape or a circular shape corresponding to the planar shape of the second channel posts 120B so as to definitely show the gibbous moon shape of the first channel post 120A.

Referring to FIG. 6, the planar gibbous moon shape of the first channel post 120A may have a simple closed curve. The simple closed curve may have at least two curves C1 and C2 having different curvatures. Particularly, the planar gibbous moon shape of the first channel post 120A may include a first sector and a second sector combined with each other. In order to ensure a space between the first channel post 120A and the gate separation layer 130, a first distance L1 between a center point of a curve C1 in the first sector and the center point P of the first sector may be longer than a second distance L2 between a center point of a curve C2 in the second sector and the center point P of the second sector. The curve C2 in the second sector may face a sidewall of the gate separation layer 130. Alternatively, as shown in FIG. 4B, the curve C2 in the second sector may face a sidewall of the slit structure 140.

When a sidewall of the first channel post 120A may make contact with the sidewall of the gate separation layer 130 or the first channel post 120A may be partially overlapped with the gate separation layer 130 due to increasing of the integration degree, the gate conductive layer 106, which may act as the gate of the drain selection transistor DST, may have a structure configured to partially surround the first channel post 120A, not fully surround the first channel post 120A to deteriorate operational characteristics of the drain selection transistor DST. However, when the first channel post 120A may have the gibbous moon shape, the space between the first channel post 120A and the gate separation layer 130 may be ensured to provide the gate conductive layer 106, which may act as the gate of the drain selection transistor DST, with a gate all around (GAA) structure configured to fully surround the first channel post 120A. Thus, the operational characteristics of the drain selection transistor DST may be improved. Further, the drain selection line DSL may be stably separated using the gate separation layer 130.

The gate separation layer 130 may be configured to separate the gate of the drain selection transistor DST or the drain selection line DSL in the memory block BLK. The gate separation layer 130 may have a linear shape extended in the first direction D1. The gate separation layer 130 may include a trench 132 and a separating insulation layer 134. The trench 132 may be formed in the electrode structure 110 to separate the uppermost gate conductive layer 106 in the electrode structure 110. The separating insulation layer 134 may be formed in the trench 132. The trench 132 may have a sidewall spaced apart from the sidewall of the first channel post 120A adjacent to the gate separation layer 130. That is, the sidewall of the trench 132 may be adjacent to the sidewall of the first channel post 120A adjacent to the gate separation layer 130 by a gap. The separating insulation layer 134 in the trench 132 may include an insulation material substantially the same as the insulation material of the insulating interlayer 104. According to the first example embodiment, one gate separation layer 130 may be positioned at a central portion of one memory block BLK. Further, numbers of the channel posts 120 at one side of the gate separation layer 130 may be substantially the same numbers of the channel posts 120 at the other side of the gate separation layer 130. Alternatively, at least two gate separation layers 130 may be arranged in one memory block BLK. For example, when the channel posts 120 may be arranged in one memory block BLK in sixteen rows along the second direction D2, total three gate separation layers 130 by four row units may be arranged.

The slit structure 140 may function as to divide the memory blocks BLK. The slit structure 140 may have a linear shape extended in the first direction D1. The slit structures 140 may be arranged spaced apart from each other by a uniform gap in the second direction D2. The slit structure 140 may include a slit trench 142, a spacer 144 and a slit conductive layer 146. The slit trench 142 may be formed through the electrode structure 110. The slit trench 142 may be partially extended into the source line layer 102. The spacer 144 may be formed on a sidewall of the slit trench 142. The slit conductive layer 146 may be formed in the slit trench 142. The slit conductive layer 146 in the slit trench 142 may be electrically connected to the source line layer 102. Further, the slit conductive layer 146 may function as the common source line CSL.

As indicated above, because the first channel post 120A adjacent to the gate separation layer 130 may have the gibbous moon shape in the planar view, the space between the gate separation layer 130 and the first channel post 120 may be ensured and the integration degree of the memory block BLK may be increased. The uppermost gate conductive layer 106 separated by the gate separation layer 130 may have the GAA structure configured to fully surround the first channel post 120A adjacent to the gate separation layer 130 due to the planar shape of the first channel post 120A to prevent the operational deteriorations of the semiconductor memory device caused by the increased integration degree.

Further, the similar planar shapes of the first channel post 120A and the second channel posts 120B may prevent the characteristic deviation between the transistors of the memory cell MC in the memory block BLK.

Furthermore, according to the first example embodiment, the third channel post 120C adjacent to the slit structure 140 may have the gibbous moon shape together with the first channel post 120A adjacent to the gate separation layer 130 to more increase the integration degree of the memory block BLK.

FIGS. 7A to 7E are cross-sectional views, which are taken along the line I-I' in FIG. 4A, illustrating a method of manufacturing a semiconductor memory device in accordance with the first example embodiment.

Figure 7A:
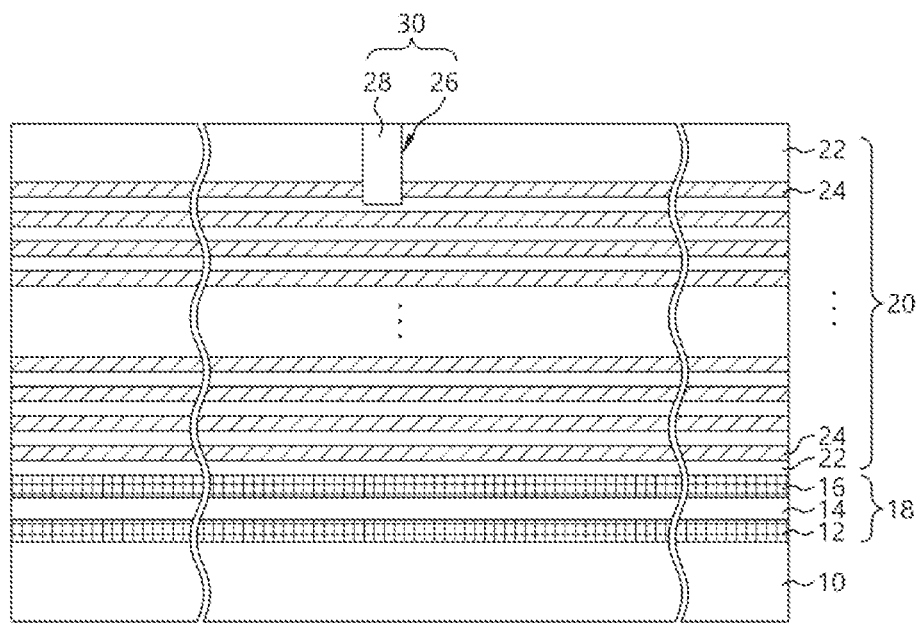
FIGS. 7A to 7E are cross-sectional views, which are taken along the line I-I' in FIG. 4A, illustrating a method of manufacturing a semiconductor memory device in accordance with the first example embodiment.

Referring to FIG. 7A, a preliminary source line layer 18 may be formed on a substrate 10. The preliminary source line layer 18 may include a first source line layer 12, a sacrificial layer 14, and a second source line layer 16 sequentially stacked. The first source line layer 12 and the second source line layer 16 may include a doped semiconductor layer. For example, the first source line layer 12 and the second source line layer 16 may include a silicon layer doped with n type impurities. The sacrificial layer 14 may include a material having an etching selectivity with respect to the first source line layer 12 and the second source line layer 16. For example, the sacrificial layer 14 may include an oxide layer, a nitride layer, an oxynitride layer, etc.

A stack structure 20 may be formed on the preliminary source line layer 18. The stack structure 20 may include first layers 22 and second layers 24 alternately stacked. The first layers 22 may be positioned at a lowermost layer and an uppermost layer of the stack structure 20. The uppermost first layer 22 may have a thickness thicker than thicknesses of the remaining first layers 22. The second layers 24 may include the sacrificial layer for forming a conductive layer including a word line, a selection line, a pad, etc. The first layer 22 may include an insulation interlayer for insulating the stacked conductive layers from each other. The first layer 22 may include an insulation material having an etching selectivity with respect to an insulation material of the second layer 24. For example, the first layers 22 may include oxide layers and the second layers 24 may include nitride layers having an etching selectivity with respect to the oxide layer.

A mask pattern may be formed on the stack structure 20. A trench 26 may be formed in the stack structure using the mask pattern as an etch barrier. The trench 26 may have a linear shape extended in the first direction D1. The trench 26 may be formed through the uppermost second layer 24. Numbers of the second layers 24 through which the trench 26 may be formed from the uppermost second layer 24 may be determined in accordance with numbers of the drain selection transistors DST serially connected with each other in the cell string. The first example embodiment may include one drain selection transistor DST in the cell string.

After removing the mask pattern, a separating insulation layer 28 may be formed in the trench 26. The separating insulation layer 28 may include an oxide layer, a nitride layer, an oxynitride layer, etc. The separating insulation layer 28 may include a material substantially the same as that of the first layer 22. For example, the separating insulation layer 28 may include the oxide layer.

Thus, before forming channel posts 40, a gate separation layer 30 including the trench 26 and the separating insulation layer 28 may be formed.

Figure 7B:
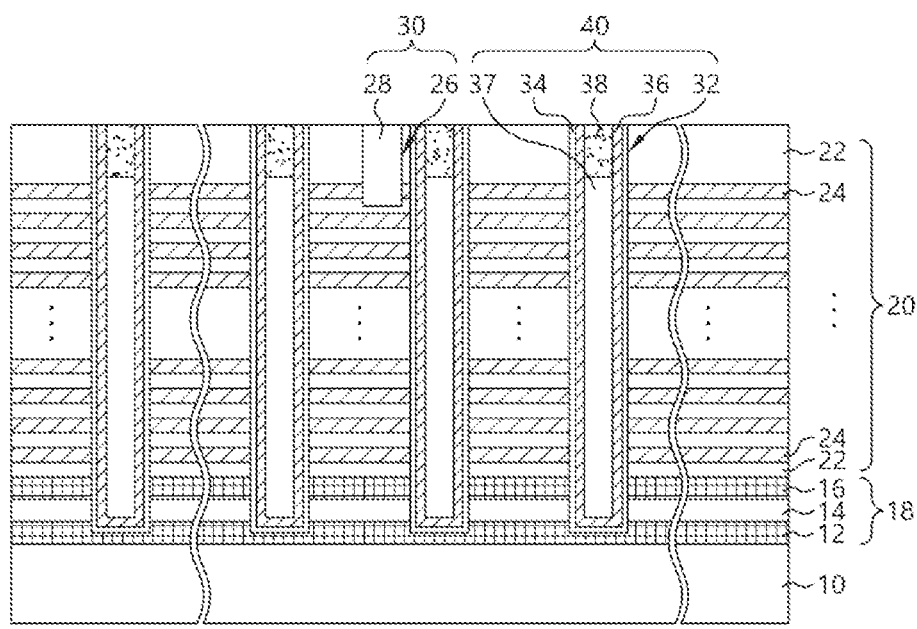

Referring to FIG. 7B, a mask pattern may then be formed on the stack structure 20. The stack structure 20, the second source line layer 16, the sacrificial layer 14, and the first source line layer 12 may be etched using the mask pattern as an etch barrier to form openings 32. The openings 32 may be formed through the stack structure 20, the second source line layer 16, and the sacrificial layer 14. The openings 32 may have a hole type shape extended into the first source line layer 12.

An opening among the openings 32 adjacent to the gate separation layer 30 may have a gibbous moon shape in a planar view. Each of the opening 32 adjacent to the gate separation layer 30 may have a sidewall spaced apart from a sidewall of the gate separation layer 30. The remaining openings 32 may have a circular shape or an elliptical shape.

After removing the mask pattern, a memory layer 34 may be formed on an inner surface of the opening 32. The memory layer 34 may include a tunnel insulation layer, a charge-trapping layer, and a blocking layer sequentially stacked. The tunnel insulation layer and the blocking layer may include oxide. The charge-trapping layer may include nitride.

A channel layer 36 may be formed on the memory layer 34. The channel layer 36 may include a semiconductor layer. For example, the channel layer 36 may include a silicon layer.

A core layer 37 may be formed on the channel layer 36 to fill the opening 32. The core layer 37 may include an oxide layer, a nitride layer, an oxynitride layer, etc.

The core layer 37 may be partially removed to form a recessed portion. A capping layer 38 may be formed in the recessed portion. The capping layer 38 may include a doped semiconductor layer. For example, the capping layer 38 may include a silicon layer doped with n type impurities. An interface between the core layer 37 and the capping layer 38 may be higher than the upper surface of the uppermost second layer 24 in the stack structure 20.

A plurality of channel posts 40 may be formed through the stack structure 20. Each of the channel posts 40 may include the opening 32, the memory layer 34, the channel layer 36, the core layer 37, and the capping layer 38.

Figure 7C:
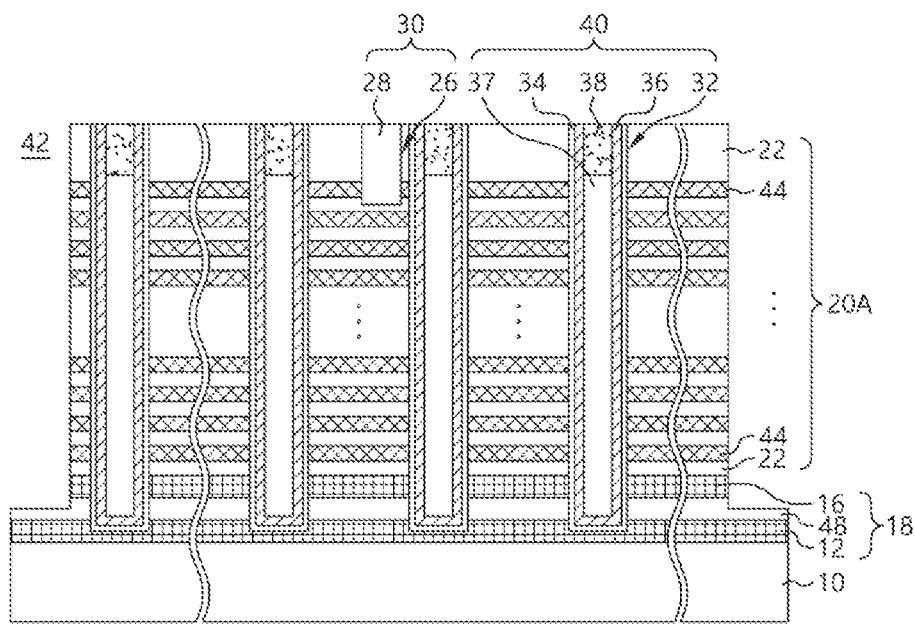

Referring to FIG. 7C, a mask pattern may be formed on the stack structure 20. The stack structure 20 may be etched using the mask pattern as an etch barrier to form a slit structure 42. The slit structure 42 may have a linear pattern extended in the first direction D1. The slit structure 42 may be positioned at both sides of the gate separation layer 30 in the second direction D2. The slit structure 42 may be formed through the stack structure 20 and the second source line layer 16. The slit structure 42 may be partially extended into the sacrificial layer 14.

After removing the mask pattern, the second layer 24 may be removed from the stack structure 20 through the slit structure 42. A conductive material may be formed in a space formed by removing the second layer 24 to form a plurality of gate conductive layers 44, thereby forming an electrode structure 20A. The electrode structure 20A may include the first layers 22 as the insulating interlayer and the gate conductive layers 44 alternately stacked.

Figure 7D:
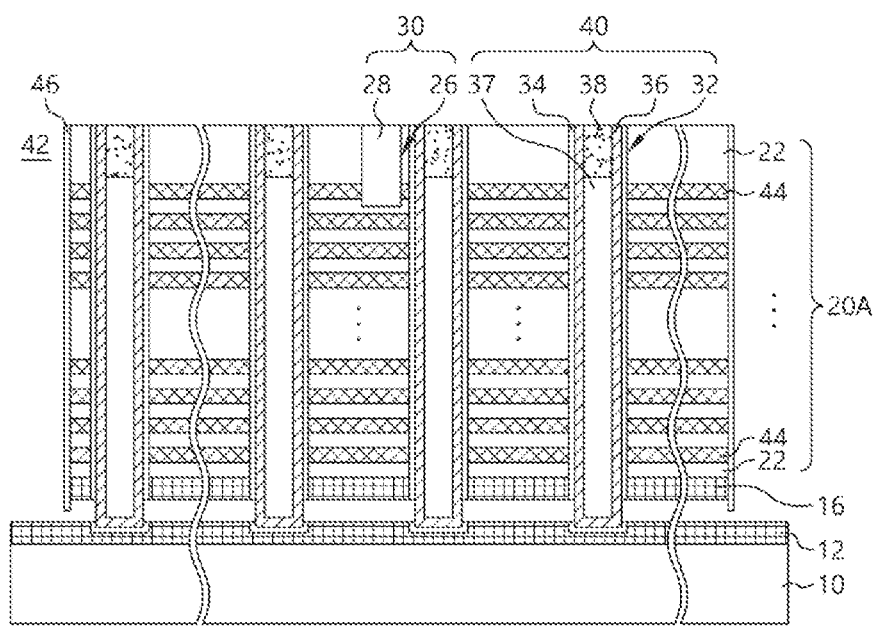

Referring to FIG. 7D, a spacer 46 may be formed on a sidewall of the slit structure 42. The spacer 46 may include a single layer including any one selected from the group of an oxide layer, a nitride layer, and an oxynitride layer or may include a multilayer including at least two selected from the group of an oxide layer, a nitride layer, and an oxynitride layer.

The sacrificial layer 14 of the preliminary source line layer 18 may be removed through the slit trench 42. The memory layer 34 exposed by removing the sacrificial layer 14 may then be etched to expose the channel layer 36 of each of the channel posts 40.

Figure 7E:
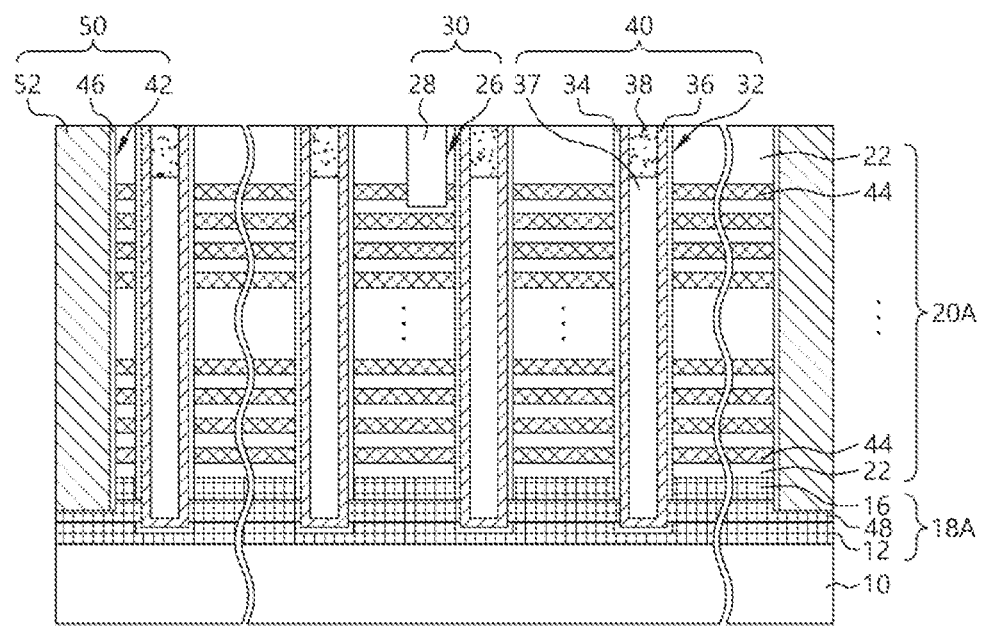

Referring to FIG. 7E, a conductive material may be formed in a space formed by removing the sacrificial layer 14 to form a third source line layer 48. The third source line layer 48 may be electrically connected with the first source line layer 12, the second source line layer 16, and the channel layer 36. Thus, a source line layer 18A including the first to third source line layers 12, 16, and 48 may be formed.

A slit conductive layer 52 may be formed in the slit trench 42. The slit conductive layer 52 may be electrically connected to the source line layer 18A. The slit conductive layer 52 may function as the common source line CSL.

Therefore, a slit structure 50 including the slit trench 42, the spacer 46, and the slit conductive layer 52 may be formed. A semiconductor memory device may be completed using general processes for forming the semiconductor memory device.

Figure 8A:
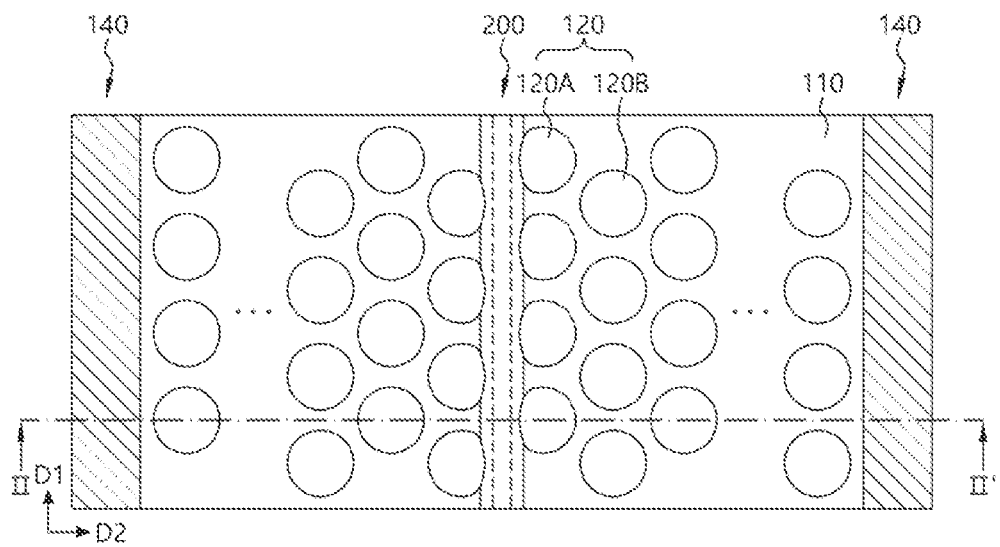
FIG. 8A is a plan view illustrating a semiconductor memory device in accordance with a second example embodiment.
Figure 8B:
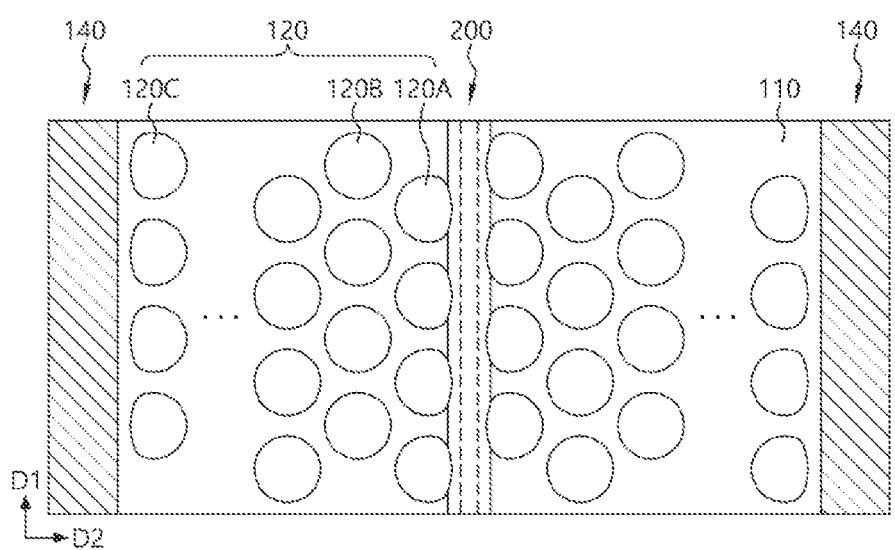
FIG. 8B is a plan view illustrating a modified semiconductor memory device in accordance with the second example embodiment.
Figure 9:
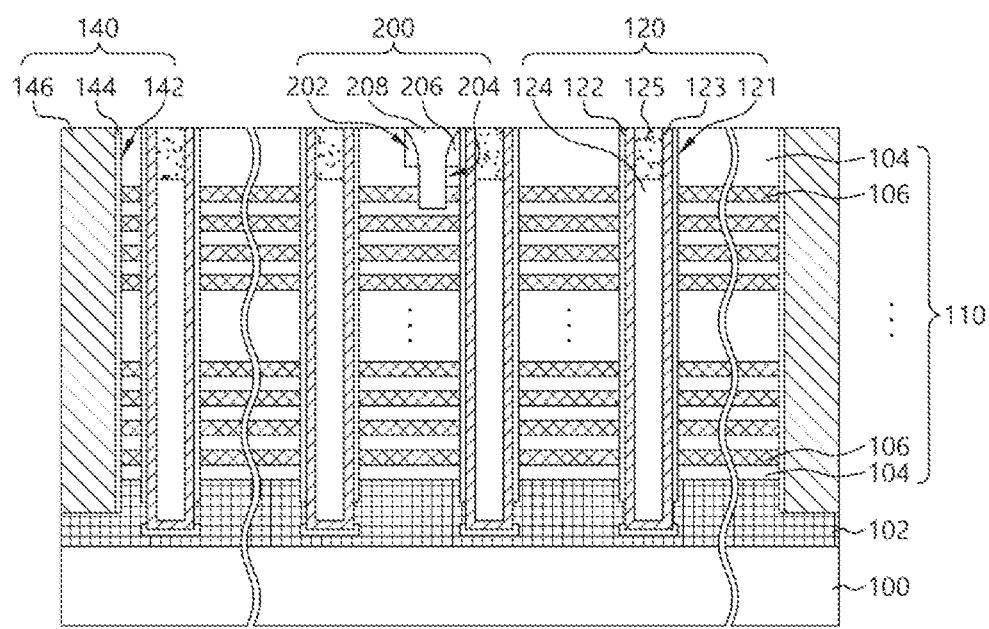
FIG. 9 is a cross-sectional view taken along a line II-II' in FIG. 8A.

FIG. 8A is a plan view illustrating a semiconductor memory device in accordance with a second example embodiment, FIG. 8B is a plan view illustrating a modified semiconductor memory device in accordance with the second example embodiment, and FIG. 9 is a cross-sectional view taken along a line II-II' in FIG. 8A.

A semiconductor memory device of this example embodiment may include elements substantially the same as those of the semiconductor memory device of the first example embodiment except for a gate separation layer. Thus, the same reference numerals may refer to the same elements and any further illustrations with respect to the same elements may be omitted herein for brevity.

Referring to FIGS. 8A and 9, a semiconductor memory device of the second example embodiment may include a source line layer 102, an electrode structure 110, a plurality of channel posts 120, a gate separation layer 200, and a slit structure 140.

The source line layer 102 may be formed on a substrate 100. The electrode structure 110 may include insulating interlayer 104 and gate conductive layers 106 alternately stacked on the source line layer 102. The channel posts 120 may be formed through the electrode structure 110. The gate separation layer 200 may be formed between the channel posts 120 to separate an uppermost gate conductive layer 106 among the gate conductive layers 106. The slit structure 140 may be formed through the electrode structure 110 to divide memory blocks BLK. A first channel post 120A among the channel posts 120 adjacent to the gate separation layer 200 may have a gibbous moon shape in a planar view. Further, as shown in FIG. 8B, a third channel post 120C adjacent to the slit structure 140 may also have the gibbous moon shape.

The gate separation layer 200 may be configured to separate the gate of the drain selection transistor DST or the drain selection line DSL in the memory block BLK. The gate separation layer 200 may have a linear pattern extended in the first direction D1. The gate separation layer 200 may have a T shaped cross-sectional shape.

The gate separation layer 200 may include a first trench 202, a spacer 206, a second trench 204, and a separating insulation layer 208. The first trench 202 may be formed in the uppermost insulating interlayer 104. The spacer 206 may be formed on a sidewall of the first trench 202. The second trench 204 may be extended from a bottom surface of the first trench 202 to separate the uppermost gate conductive layer 106. The second trench 204 may have a width narrower than a width of the first trench 202. The separating insulation layer 208 may be formed in the first trench 202 and the second trench 204. The sidewall of the first trench 202 may be configured to make contact with the sidewall of the first channel post 120A adjacent to the gate separation layer 200. The second trench 204 may have a sidewall spaced apart from the sidewall of the first channel post 120A adjacent to the gate separation layer 200 by a gap. The separating insulation layer 208 in the first trench 202 and the second trench 204 may include an insulation material substantially the same as the insulation material of the insulating interlayer 104. The spacer 206 on the sidewall of the first trench 202 may include a single layer of any one selected from the group consisting of an oxide layer, a nitride layer, and an oxynitride layer or may include a multilayer of at least two selected from the group consisting of an oxide layer, a nitride layer, and an oxynitride layer. The spacer 206 on the sidewall of the first trench 202 may include a material substantially the same as that of the separating insulation layer 208 and the insulating interlayer 104.

According to the second example embodiment, one gate separation layer 200 may be positioned at a central portion of one memory block BLK. Further, numbers of the channel posts 120 at one side of the gate separation layer 200 may be substantially the same numbers of the channel posts 120 at the other side of the gate separation layer 200. Alternatively, at least two gate separation layers 200 may be arranged on one memory block BLK. For example, when the channel posts 120 may be arranged in one memory block BLK in sixteen rows along the second direction D2, total three gate separation layers 200 by four row units may be arranged.

As indicated above, because the first channel post 120A adjacent to the gate separation layer 200 may have the gibbous moon shape in the planar view, the space between the gate separation layer 200 and the first channel post 120 may be ensured and the integration degree of the memory block BLK may be increased. The uppermost gate conductive layer 106 separated by the gate separation layer 200 may have the GAA structure configured to fully surround the first channel post 120A adjacent to the gate separation layer 200 due to the planar shape of the first channel post 120A to prevent the operational deteriorations of the semiconductor memory device caused by the increased integration degree.

Further, the similar planar shapes of the first channel post 120A and the second channel posts 120B may prevent the characteristic deviation between the transistors of the memory cell MC in the memory block BLK.

Furthermore, according to the second example embodiment, the third channel post 120C adjacent to the slit structure 140 may have the gibbous moon shape together with the first channel post 120A adjacent to the gate separation layer 200 to more increase the integration degree of the memory block BLK.

Additionally, the T-shaped gate separation layer 200 may include the first trench 202, the spacer 206, the second trench 204, and the separating insulation layer 208 to readily increase the integration degree of the memory block and to effectively prevent the operational deteriorations of the semiconductor memory device caused by the increased integration degree.

Figure 10A:
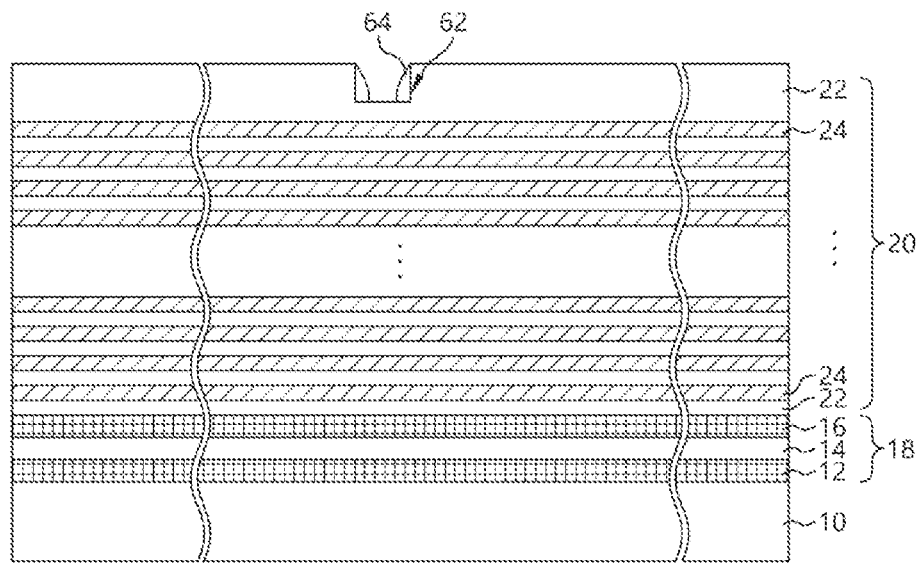
FIGS. 10A to 10C are cross-sectional views, which are taken along the line II-II' in FIG. 8A, illustrating a method of manufacturing a semiconductor memory device in accordance with the second example embodiment.
Figure 10B:
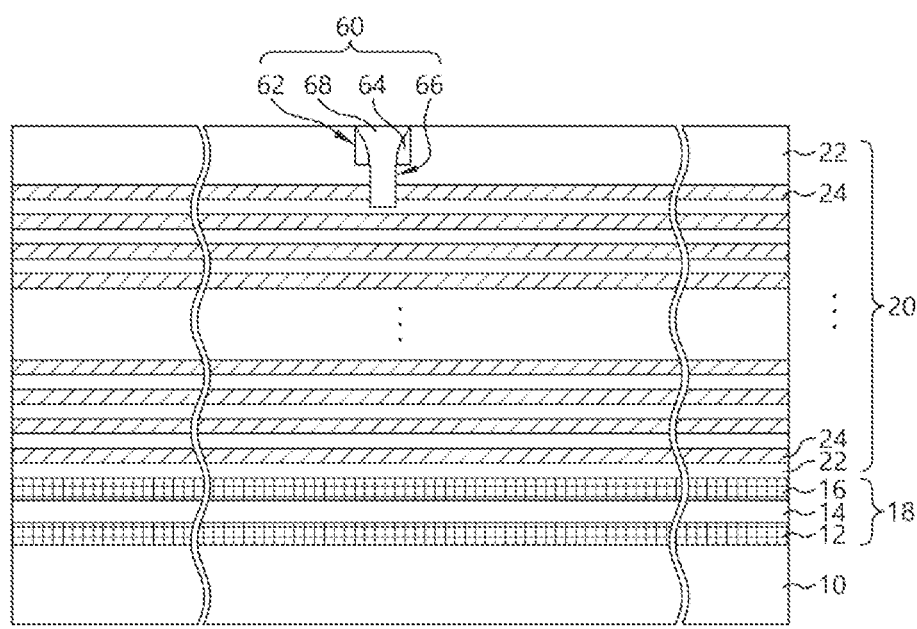
Figure 10C:
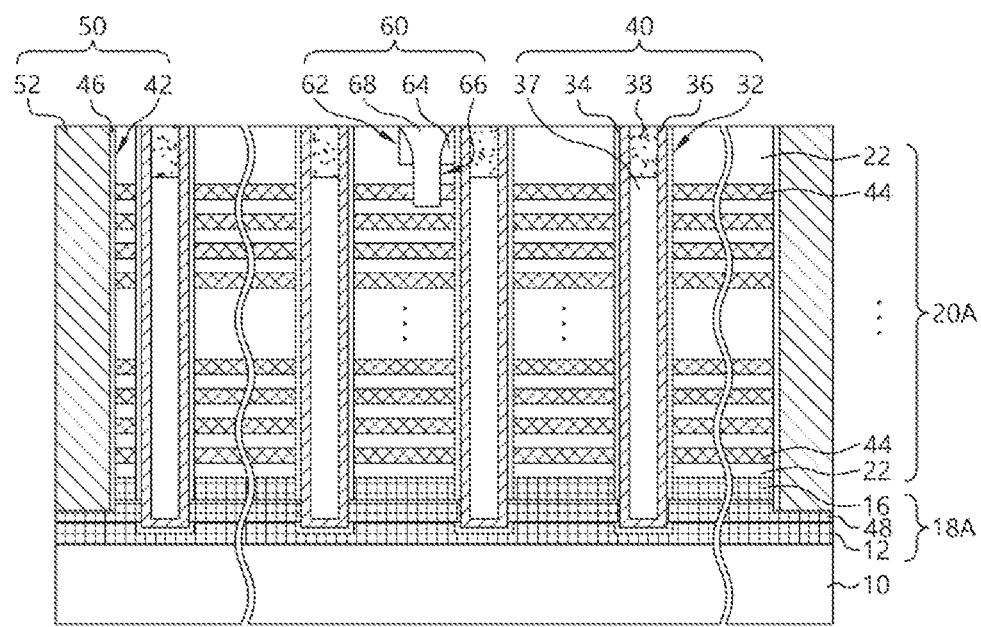

FIGS. 10A to 10C are cross-sectional views, which are taken along the line II-II' in FIG. 8A, illustrating a method of manufacturing a semiconductor memory device in accordance with the second example embodiment.

Referring to FIG. 10A, a preliminary source line layer 18 may be formed on a substrate 10. The preliminary source line layer 18 may include a first source line layer 12, a sacrificial layer 14, and a second source line layer 16 sequentially stacked.

A stack structure 20 may be formed on the preliminary source line layer 18. The stack structure 20 may include first layers 22 and second layers 24 alternately stacked. For example, the first layers 22 may include oxide layers and the second layers 24 may include nitride layers.

A mask pattern may be formed on the stack structure 20. A first trench 62 may be formed in the stack structure 20 using the mask pattern as an etch barrier. The first trench 62 may have a linear shape extended in the first direction D1. The first trench 62 may be formed through the uppermost first layer 22. That is, the first trench 62 may have a bottom surface higher than an upper surface of the uppermost second layer 24.

A spacer 64 may be formed on a sidewall of the first trench 62. The spacer 64 may include a single layer of any one selected from the group consisting of an oxide layer, a nitride layer, and an oxynitride layer or may include a multilayer of at least two selected from the group consisting of an oxide layer, a nitride layer, and an oxynitride layer.

Referring to FIG. 10B, the stack structure 20 may be etched using a mask pattern and the spacer 64 as an etch barrier to form a second trench 66. The second trench 66 may be configured to separate the uppermost second layer 24. The second trench 66 may have a width narrower than a width of the first trench 62. The first trench 62 and the second trench 64 may be connected with each other to form a T shaped cross-sectional shape.

After removing the mask pattern, a separating insulation layer 68 may be formed in the first trench 62 and the second trench 66. The separating insulation layer 68 may include an oxide layer, a nitride layer, an oxynitride layer, etc. The separating insulation layer 68 may include a material substantially the same as that of the first layer 22. For example, the separating insulation layer 28 may include the oxide layer.

Thus, before forming channel posts 40, a T-shaped gate separation layer 60 including the first trench 62, the spacer 64, the second trench 66, and the separating insulation layer 68 may be formed.

Referring to FIG. 10C, a mask pattern may then be formed on the stack structure 20. The stack structure 20, the second source line layer 16, the sacrificial layer 14, and the first source line layer 12 may be etched using the mask pattern as an etch barrier to form openings 32. The openings 32 may be formed through the stack structure 20, the second source line layer 16, and the sacrificial layer 14. The openings 32 may have a hole type shape extended into the first source line layer 12.

An opening among the openings 32 adjacent to the gate separation layer 60 may have a gibbous moon shape in a planar view. Each of the opening 32 adjacent to the gate separation layer 60 may have a sidewall making contact with the sidewall of the first trench 62 and spaced apart from the sidewall of the second trench 66. That is, during the stack structure 20 may be etched to form the openings 32, the spacer 64 on the sidewall of the first trench 62 and the separating insulation layer 68 in the first trench 62 may also be partially etched. The remaining openings 32 may have a circular shape or an elliptical shape.

After removing the mask pattern, a memory layer 34 may be formed on an inner surface of the opening 32. The memory layer 34 may include a tunnel insulation layer, a charge-trapping layer, and a blocking layer sequentially stacked. The tunnel insulation layer and the blocking layer may include oxide. The charge-trapping layer may include nitride.

A channel layer 36 may be formed on the memory layer 34. The channel layer 36 may include a semiconductor layer. For example, the channel layer 36 may include a silicon layer.

A core layer 37 may be formed on the channel layer 36 to fill the opening 32. The core layer 37 may include an oxide layer, a nitride layer, an oxynitride layer, etc.

The core layer 37 may be partially removed to form a recessed portion. A capping layer 38 may be formed in the recessed portion. The capping layer 38 may include a doped semiconductor layer. For example, the capping layer 38 may include a silicon layer doped with n type impurities. An interface between the core layer 37 and the capping layer 38 may be higher than the upper surface of the uppermost second layer 24 in the stack structure 20.

A plurality of channel posts 40 may be formed through the stack structure 20. Each of the channel posts 40 may include the opening 32, the memory layer 34, the channel layer 36, the core layer 37, and the capping layer 38.

As indicated above with reference to FIGS. 7C to 7E, a semiconductor memory device may be completed using general processes for forming the semiconductor memory device.

Figure 11A:
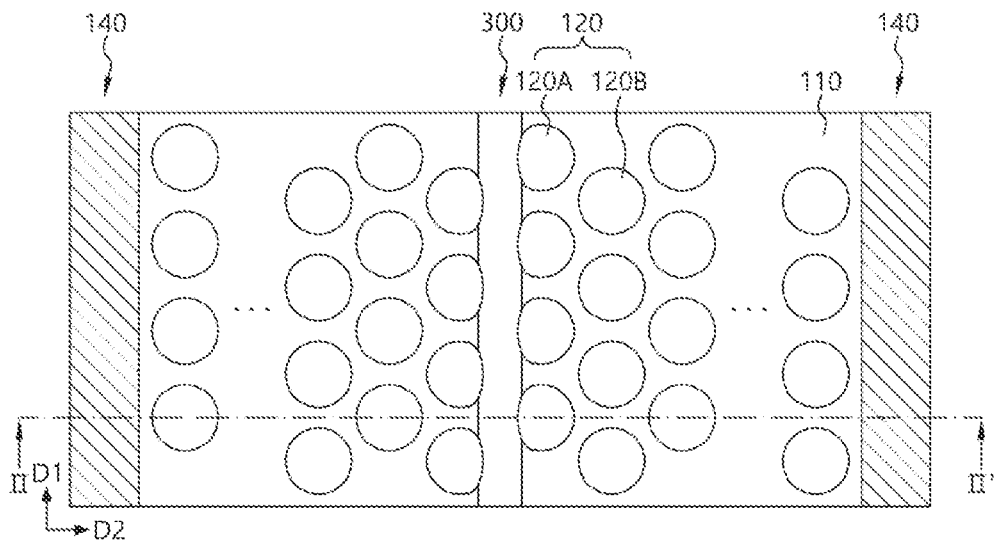
FIG. 11A is a plan view illustrating a semiconductor memory device in accordance with a third example embodiment.
Figure 11B:
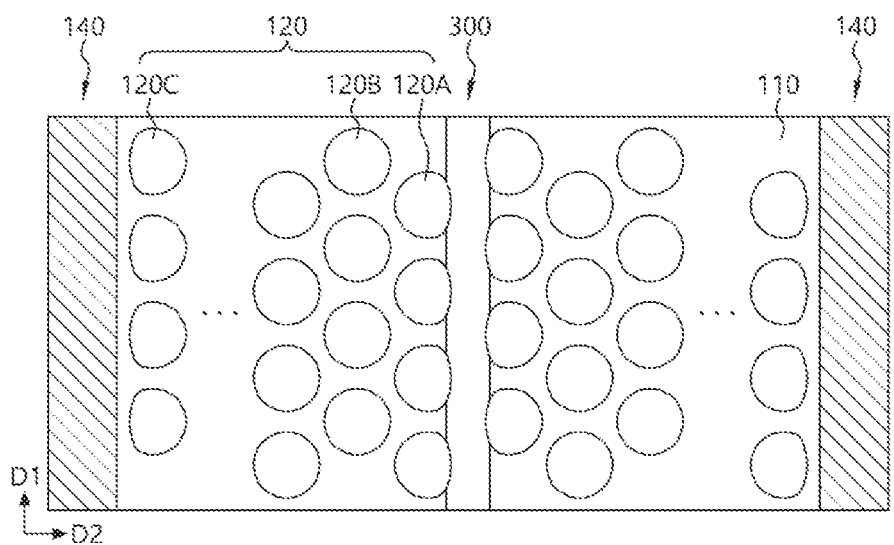
FIG. 11B is a plan view illustrating a modified semiconductor memory device in accordance with the third example embodiment.
Figure 12:
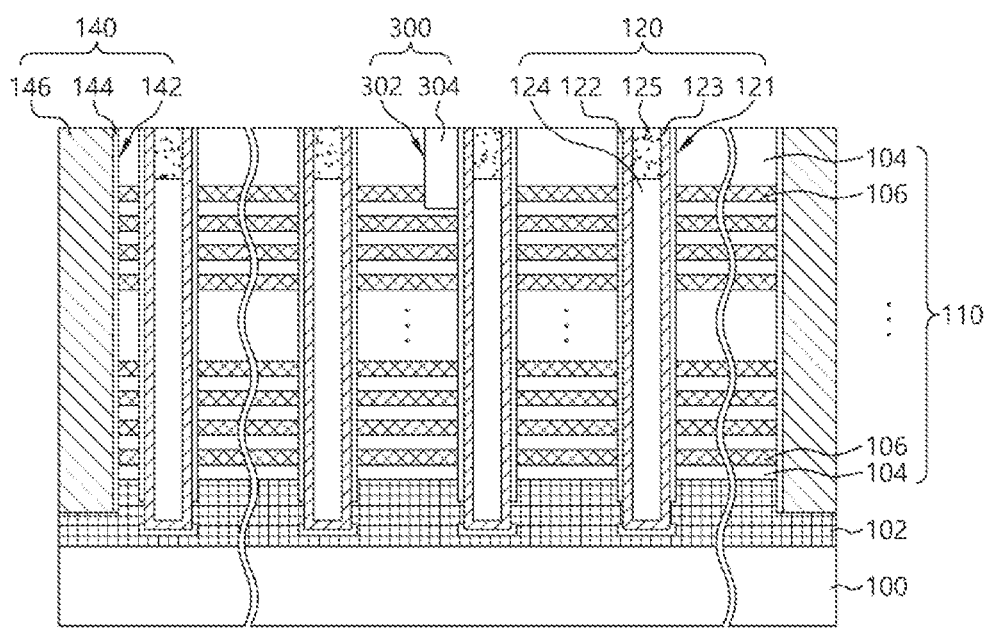
FIG. 12 is a cross-sectional view taken along a line III-III' in FIG. 11A.

FIG. 11A is a plan view illustrating a semiconductor memory device in accordance with a third example embodiment, FIG. 11B is a plan view illustrating a modified semiconductor memory device in accordance with the third example embodiment, and FIG. 12 is a cross-sectional view taken along a line III-III' in FIG. 11A.

A semiconductor memory device of this example embodiment may include elements substantially the same as those of the semiconductor memory device of the first example embodiment except for a gate separation layer. Thus, the same reference numerals may refer to the same elements and any further illustrations with respect to the same elements may be omitted herein for brevity.

Referring to FIGS. 11A and 12, a semiconductor memory device of the third example embodiment may include a source line layer 102, an electrode structure 110, a plurality of channel posts 120, a gate separation layer 300, and a slit structure 140.

The source line layer 102 may be formed on a substrate 100. The electrode structure 110 may include insulating interlayer 104 and gate conductive layers 106 alternately stacked on the source line layer 102. The channel posts 120 may be formed through the electrode structure 110. The gate separation layer 300 may be formed between the channel posts 120 to separate an uppermost gate conductive layer 106 among the gate conductive layers 106. The slit structure 140 may be formed through the electrode structure 110 to divide memory blocks BLK. A first channel post 120A among the channel posts 120 adjacent to the gate separation layer 300 may have a gibbous moon shape in a planar view. Further, as shown in FIG. 11B, a third channel post 120C adjacent to the slit structure 140 may also have the gibbous moon shape.

The gate separation layer 300 may be configured to separate the gate of the drain selection transistor DST or the drain selection line DSL in the memory block BLK. The gate separation layer 300 may have a linear pattern extended in the first direction D1. The gate separation layer 300 may be partially overlapped with the first channel post 120A to have a wave shape.

Particularly, the gate separation layer 300 may include a trench 302 and a separating insulation layer 304. The trench 302 may be formed in the electrode structure 110 to separate the uppermost gate conductive layer 106. The separating insulation layer 304 may be formed in the trench 302. The trench 302 may have a sidewall configured to make contact with the sidewall of the first channel post 120A adjacent to the gate separation layer 300. Because the sidewall of the gate separation layer 300 may make contact with the sidewall of the first channel post 120A adjacent to the gate separation layer 300, the uppermost gate conductive layer 106 in the electrode structure 110 may be configure to partially surround the first channel post 120A. Therefore, a bias applied to the first channel post 120A may be different from a bias applied to the remaining channel posts 120, i.e., the second channel post 120B and the third channel post 120C.

As indicated above, because the sidewall of the gate separation layer 300 may make contact with the sidewall of the first channel post 120A, the integration degree of the memory block BLK may be easily increased.

Further, because the first channel post 120A adjacent to the gate separation layer 300 may have the gibbous moon shape in the planar view, although previously forming the gate separation layer 300 before the channel posts 120, the gate separation layer 300 may not be excessively lost to improve structural stability.

Further, the similar planar shapes of the first channel post 120A and the second channel posts 120B may prevent the characteristic deviation between the transistors of the memory cell MC in the memory block BLK.

Furthermore, according to the third example embodiment, the third channel post 120C adjacent to the slit structure 140 may have the gibbous moon shape together with the first channel post 120A adjacent to the gate separation layer 300 to more increase the integration degree of the memory block BLK.

The semiconductor device in accordance with the present embodiment can be fabricated through the above-described process, and processes which are not described may be performed through publicly known technology.

Figure 13:
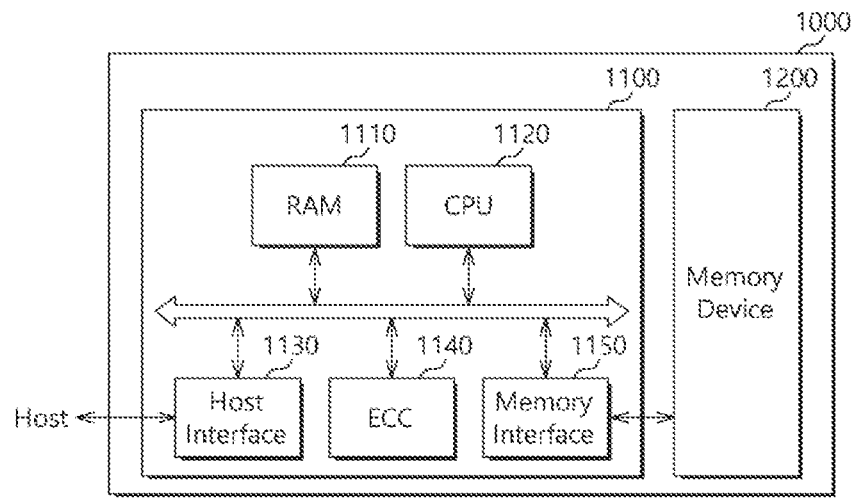
FIG. 13 is a block diagram of the configuration of a memory system according to an embodiment of the present disclosure.

FIG. 13 is a block diagram of the configuration of a memory system 1000 according to an embodiment.

As illustrated in FIG. 13, the memory system 1000 may include a memory device 1200 and a controller 1100.

The memory device 1200 may be used to store various data types such as text, graphic and software code. The memory device 1200 may be a non-volatile memory. The memory device 1200 may be the semiconductor device described above with reference to FIGS. 4A to 12. In addition, the memory device 1200 may include an electrode structure including insulating interlayers and gate conductive layers alternately stacked; a plurality of channel posts formed through the electrode structure; and at least one gate separation layer arranged between the channel posts to separate an uppermost gate conductive layer among the gate conductive layers in the stack structure, wherein channel posts among the channel posts adjacent to the gate separation layer have a gibbous moon shape in a planar view. Because the memory device 1200 is formed and manufactured in the above-described manner, a detailed description thereof will be omitted.

The controller 1100 may be couple to a host and the memory device 1200, and may access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, because the memory system 1000 is easy to manufacture and includes the memory device 1200 having a stable structure and improved characteristics, the characteristics of the memory system 1000 may also be improved.

Figure 14:
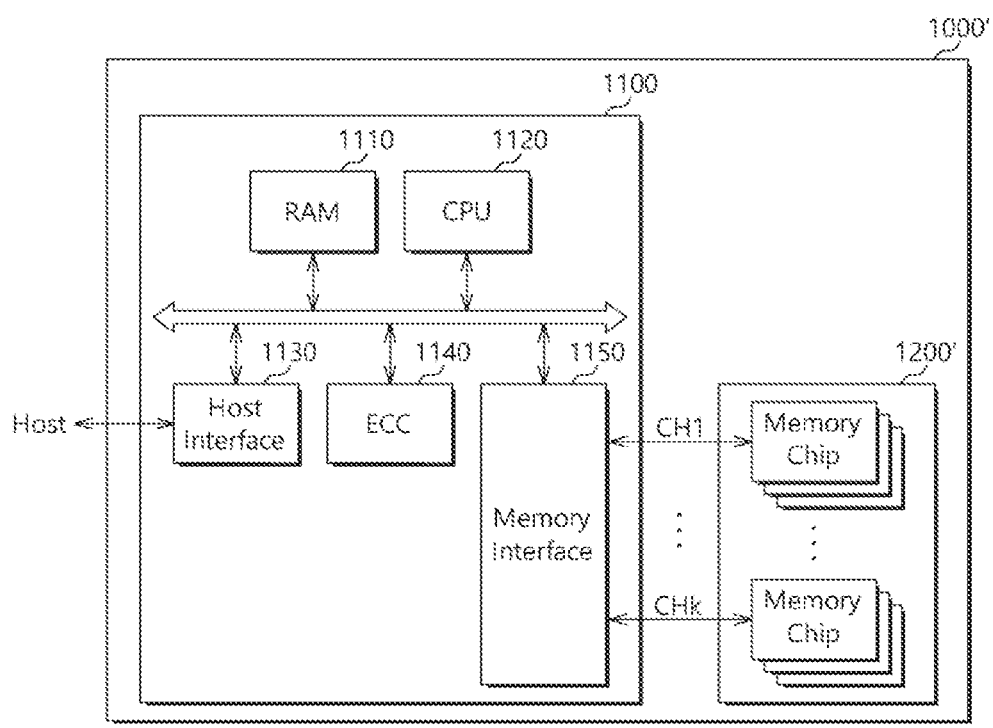
FIG. 14 is a block diagram of the configuration of a memory system according to an embodiment of the present disclosure.

FIG. 14 is a block diagram of the configuration of a memory system 1000' according to an embodiment. Hereinafter, a description of common contents with the earlier described embodiment is omitted.

As illustrated in FIG. 14, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory device. The memory device 1200' may be the semiconductor device described above with reference to FIGS. 4A to 12. In addition, the memory device 1200' may include an electrode structure including insulating interlayers and gate conductive layers alternately stacked; a plurality of channel posts formed through the electrode structure; and at least one gate separation layer arranged between the channel posts to separate an uppermost gate conductive layer among the gate conductive layers in the stack structure, wherein channel posts among the channel posts adjacent to the gate separation layer have a gibbous moon shape in a planar view. Because the memory device 1200' is formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, because the memory system 1000' is easy to manufacture and includes the memory device 1200' having a stable structure and improved characteristics, the characteristics of the memory system 1000' may also be improved. In addition, the data storage capacity of the memory system 1000' may be further increased by forming the memory device 1200' using a multi-chip package.

Figure 15:
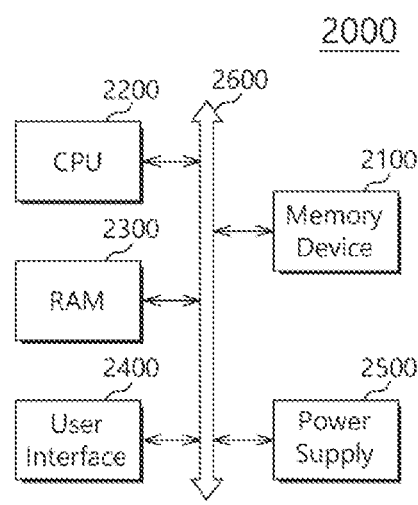
FIG. 15 is a block diagram of the configuration of a computing system according to an embodiment of the present disclosure.

FIG. 15 is a block diagram of the configuration of a computing system 2000 according to an embodiment. Hereinafter, a description of common contents with the earlier described embodiments is omitted.

As illustrated in FIG. 15, the computing system 2000 may include a memory device 2100, a CPU 2200, a random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400, and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 4A to 12. The memory device 2100 may include an electrode structure including insulating interlayers and gate conductive layers alternately stacked; a plurality of channel posts formed through the electrode structure; and at least one gate separation layer arranged between the channel posts to separate an uppermost gate conductive layer among the gate conductive layers in the stack structure, wherein channel posts among the channel posts adjacent to the gate separation layer have a gibbous moon shape in a planar view. Because the memory device 2100 is formed and manufactured in the above-described manner, a detailed description thereof will be omitted.

In addition, as described above with reference to FIG. 14, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, because the computing system 2000 is easy to manufacture, and includes a memory device 2100 having a stable structure and improved characteristics, the characteristics of the computing system 2000 may also be improved.

Figure 16:
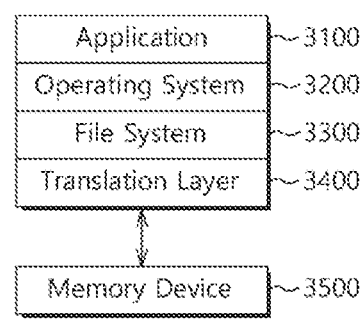
FIG. 16 is a block diagram of a computing system according to an embodiment of the present disclosure.

FIG. 16 is a block diagram of a computing system 3000 according to an embodiment.

As illustrated in FIG. 16, the computing system 3000 may include a software layer that has an operating system 3100 an application 3200, a file system 3300, and a translation layer 3400. In addition, the computing system 3000 may include a hardware layer such as a memory system 3500.

The operating system 3100 manages software and hardware resources of the computing system 3000. The operating system 3100 may control program execution of a central processing unit. The application 3200 may include various application programs executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS), or a journaling file system (JFS).

FIG. 16 illustrates the operating system 3100, the application 3200, and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor memory device described above with reference to FIGS. 4A to 12. In addition, the memory device 3500 may include an electrode structure including insulating interlayers and gate conductive layers alternately stacked; a plurality of channel posts formed through the electrode structure; and at least one gate separation layer arranged between the channel posts to separate an uppermost gate conductive layer among the gate conductive layers in the stack structure, wherein channel posts among the channel posts adjacent to the gate separation layer have a gibbous moon shape in a planar view. Because the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

As described above, because the computing system 3000 is easy to manufacture, and includes a memory device 3500 having a stable structure and improved characteristics, the characteristics of the computing system 3000 may also be improved.

The above described embodiments of the present teachings are intended to illustrate and not to limit the present invention. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A method of manufacturing a semiconductor memory device, the method comprising:
    alternately stacking a plurality of insulating interlayers that are alternately stacked with a plurality of sacrificial layers to form a stack structure;
    selectively etching the stack structure to form a gate separation layer configured to separate an uppermost sacrificial layer among the plurality of sacrificial layers;
    forming a plurality of channel posts through the stack structure, channel posts among the plurality of the channel posts adjacent to the gate separation layer having a first curved portion and a second curved portion having a curvature different from a curvature of the first curved portion in a planar view; and
    replacing the plurality of sacrificial layers by a plurality of gate conductive layers.

2. The method of claim 1, further comprising forming a slit structure through the stack structure at both sides of the gate separation layer,
    wherein channel posts among the plurality of channel posts adjacent to the slit structure have different curvatures in a planar view.

3. The method of claim 1, wherein the curvature of the first curved portion is greater than the curvature of the second curved portion,
    wherein the channel posts adjacent to the gate separation layer is formed to face the second curved portions of the channel posts to the gate separation layer, and wherein plane structures of the channel posts adjacent to the gate separation layer includes a simple closed curve.

4. The method of claim 1, wherein each of the channel posts adjacent to the gate separation layer is formed to include a first sector and a second sector base on a point, and
the first sector has a central angle different from a central angle of the second sector.

5. The method of claim 4, wherein a first distance between the point of a chord of the first sector and the point of the first sector is shorter than a second distance between the point of a chord of the second sector.

6. The method of claim 1, wherein forming the gate separation layer comprises:
selectively etching a selected portion of the stack structure to form a trench; and
forming a separating insulation layer in the trench,
wherein the selected portion of the stack structure comprises at least the uppermost sacrificial layer.

7. The method of claim 1, wherein forming the channel posts through the stack structure comprises providing the channel posts adjacent to the gate separation layer with a sidewall spaced apart from the gate separation layer.

8. The method of claim 1, wherein forming the channel posts through the stack structure comprises providing the channel posts adjacent to the gate separation layer with a sidewall configured to make contact with the gate separation layer.

9. The method of claim 1, wherein forming the gate separation layer comprises:
selectively etching an uppermost insulating interlayer in the stack structure to form a first trench;
forming a spacer on a sidewall of the first trench;
etching the stack structure using the spacer as an etch barrier to form a second trench extended from a bottom surface of the first trench and having a width narrower than a width of the first trench to separate the uppermost gate conductive layer; and
filling the first trench and the second trench with a separating insulation layer.

10. The method of claim 9, wherein forming the channel posts through the stack structure comprises providing the channel posts adjacent to the gate separation layer with a sidewall configured to make contact with the sidewall of the first trench and spaced apart from a sidewall of the second trench.

* * * * *